United States Patent
Johnson et al.

(10) Patent No.: US 9,112,094 B2
(45) Date of Patent: Aug. 18, 2015

(54) COPPER TIN SULFIDE AND COPPER ZINC TIN SULFIDE INK COMPOSITIONS

(75) Inventors: Lynda Kaye Johnson, Wilmington, DE (US); John W. Catron, Jr., Smyrna, DE (US); Daniela Rodica Radu, West Grove, PA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 695 days.

(21) Appl. No.: 13/319,819

(22) PCT Filed: May 21, 2010

(86) PCT No.: PCT/US2010/035804
§ 371 (c)(1),
(2), (4) Date: Nov. 10, 2011

(87) PCT Pub. No.: WO2010/135665
PCT Pub. Date: Nov. 25, 2010

(65) Prior Publication Data
US 2012/0061628 A1    Mar. 15, 2012

Related U.S. Application Data

(60) Provisional application No. 61/180,179, filed on May 21, 2009, provisional application No. 61/180,181, filed on May 21, 2009, provisional application No. 61/180,184, filed on May 21, 2009, provisional application No. 61/180,186, filed on May 21, 2009.

(51) Int. Cl.
| | |
|---|---|
| *H01L 31/18* | (2006.01) |
| *B01J 2/00* | (2006.01) |
| *B82Y 30/00* | (2011.01) |
| *C01G 19/00* | (2006.01) |
| *C09D 11/037* | (2014.01) |
| *C23C 18/12* | (2006.01) |
| *H01L 31/032* | (2006.01) |
| *H01L 21/02* | (2006.01) |
| *H01L 21/00* | (2006.01) |
| *C23C 18/00* | (2006.01) |

(52) U.S. Cl.
CPC ............... *H01L 31/18* (2013.01); *B01J 2/006* (2013.01); *B82Y 30/00* (2013.01); *C01G 19/006* (2013.01); *C09D 11/037* (2013.01); *C23C 18/1204* (2013.01); *C23C 18/1279* (2013.01); *H01L 21/0256* (2013.01); *H01L 21/02557* (2013.01); *H01L 21/02568* (2013.01); *H01L 21/02614* (2013.01); *H01L 21/02628* (2013.01); *H01L 31/0324* (2013.01); *C01P 2002/72* (2013.01); *C01P 2004/04* (2013.01); *C01P 2004/62* (2013.01); *C01P 2004/64* (2013.01)

(58) Field of Classification Search
CPC ....... B01J 2/006; B82Y 30/00; C09D 11/037; C23C 18/1204; C23C 18/1279; H01L 21/02557; H01L 21/0256; H01L 21/02568; H01L 21/02614; H01L 21/02628; H01L 31/0324; H01L 31/18
USPC ...................... 252/519.21, 519.34; 106/31.92
See application file for complete search history.

(56) References Cited

U.S. PATENT DOCUMENTS

| | | | |
|---|---|---|---|
| 5,100,471 A | * 3/1992 | Winnik et al. | 523/216 |
| 7,691,294 B2 | * 4/2010 | Chung et al. | 252/500 |
| 2005/0009225 A1 | 1/2005 | Mitzi et al. | |
| 2007/0298160 A1 | * 12/2007 | Jang et al. | 427/58 |
| 2009/0004445 A1 | 1/2009 | Park et al. | |
| 2009/0162946 A1 | 6/2009 | Joseph | |
| 2010/0134520 A1 | 6/2010 | Coe-Sullivan et al. | |
| 2010/0189901 A1 | 7/2010 | Chung et al. | |

FOREIGN PATENT DOCUMENTS

| | | |
|---|---|---|
| WO | WO2007134834 A2 | * 11/2007 |
| WO | WO 2007134843 A2 | * 11/2007 |

OTHER PUBLICATIONS

ChemSpider. Ethyl 4-hydroxybenzoate. p. 1. (Discloses boiling point of ethyl 4-hydroxybenzoate).*
Tanaka et al. "Preparation of Cu2ZnSnS4 thin films by sulfurizing sol-gel deposited precursors". Available online May 10, 2007. Science Direct, 91 (2007) 1199-1201. Total Pages 3.*
Green, M.L.H., A new approach to the formal classification of covalent compounds of the elements, Journal of Organometallic Chemistry, 1995, pp. 127-148, vol. 500.
International Search Report dated Oct. 20, 2010, International Application No. PCT/US2010/035804.

* cited by examiner

*Primary Examiner* — Mark Kopec
*Assistant Examiner* — Danny N Kang

(57) ABSTRACT

This invention relates to ink compositions useful for preparing films of CTS and CZTS and their selenium analogues on a substrate. Such films are useful in the preparation of photovoltaic devices.

14 Claims, No Drawings

COPPER TIN SULFIDE AND COPPER ZINC TIN SULFIDE INK COMPOSITIONS

CROSS REFERENCE TO RELATED APPLICATIONS

This application claims priority under 35 U.S.C. §119(e) from, and claims the benefit of, the following U.S. Provisional Applications No. 61/180,179, No. 61/180,181, No. 61/180,184, and No. 61/180,186; each of which was filed on May 21, 2009, and each of which is by this reference incorporated in its entirety as a part hereof for all purposes.

FIELD OF THE INVENTION

This invention relates to compositions useful for preparing films of CZTS and its selenium analogues on a substrate. Such films are useful in preparing photovoltaic devices.

BACKGROUND

Crystalline multinary-metal chalcogenide compositions containing only non-toxic and abundant elements are of particular interest in developing environmentally sustainable processes and devices. Copper tin sulfide ($Cu_2SnS_3$ or "CTS") and copper zinc tin sulfide ($Cu_2ZnSnS_4$ or "CZTS") are particularly useful examples of this class of materials, and are of interest due to their potential applications as small band-gap semiconductors, as nonlinear materials, and as suitable candidates for photovoltaic cell materials.

Thin-film photovoltaic cells typically use semiconductors such as CdTe or copper indium gallium sulfide/selenide (CIGS) as an energy absorber material. Due to toxicity of cadmium and the limited availability of indium, alternatives are sought CZTS possesses a band gap energy of about 1.5 eV and a large absorption coefficient (approx. $10^4$ cm$^{-1}$), making it a promising CIGS replacement.

Challenges in making CZTS thin-films are illustrative of the general challenges that must be surmounted in making films of crystalline multinary-metal chalcogenide compositions. Current techniques to make CZTS thin films (e.g., thermal evaporation, sputtering, hybrid sputtering, pulsed laser deposition and electron beam evaporation) require complicated equipment and therefore tend to be expensive. Electrochemical deposition is an inexpensive process, but compositional non-uniformity and/or the presence of secondary phases prevents this method from generating high-quality CZTS thin-films. CZTS thin-films can also be made by the spray pyrolysis of a solution containing metal salts, typically $CuCl$, $ZnCl_2$, and $SnCl_4$, using thiourea as the sulfur source. This method tends to yield films of poor morphology, density and grain size. Photochemical deposition has also been shown to generate p-type CZTS thin films. However, the composition of the product is not well-controlled, and it is difficult to avoid the formation of impurities such as hydroxides. The synthesis of CZTS nanoparticles, which incorporate high-boiling amines as capping agents, has also been disclosed. The presence of capping agents in the nanoparticle layer may contaminate and lower the density of the annealed CZTS film.

A hybrid solution-particle approach to CZTS involving the preparation of a hydrazine-based slurry comprising dissolved Cu—Sn chalcogenides (S or S—Se), Zn-chalcogenide particles, and excess chalcogen has been reported. However, hydrazine is a highly reactive and potentially explosive solvent that is described in the Merck Index as a "violent poison."

Hence, there still exists a need for simple, low-cost, scalable materials and processes with a low number of operations that provide high-quality, crystalline CTS and CZTS films with tunable composition and morphology. There also exists a need for low-temperature routes to these materials using solvents and reagents with relatively low toxicity.

SUMMARY

One aspect of this invention is an ink comprising:
  i) a copper source selected from the group consisting of copper complexes of nitrogen-, oxygen-, carbon-, sulfur-, and selenium-based organic ligands, copper sulfides, copper selenides, and mixtures thereof;
  ii) a tin source selected from the group consisting of tin complexes of nitrogen-, oxygen-, carbon-, sulfur-, and selenium-based organic ligands, tin hydrides, tin sulfides, tin selenides, and mixtures thereof;
  iii) optionally, a zinc source selected from the group consisting of zinc complexes of nitrogen-, oxygen-, carbon-, sulfur-, and selenium-based organic ligands, zinc sulfides, zinc selenides, and mixtures thereof;
  iv) optionally, a chalcogen compound selected from the group consisting of: elemental S, elemental Se, $CS_2$, $CSe_2$, CSSe, $R^1S$—Z, $R^1Se$—Z, $R^1S$—$SR^1$, $R^1Se$—$SeR^1$, $R^2C(S)$S—Z, $R^2C(Se)Se$—Z, $R^2C(S)S$—$SC(S)R^2$, $R^2C(Se)Se$—$SeC(Se)R^2$, $R^1C(O)S$—Z, and mixtures thereof, with each Z independently selected from the group consisting of: H, $NR^4_4$, and $SiR^5_3$; wherein each $R^1$ and $R^5$ is independently selected from the group consisting of: hydrocarbyl and O—, N—, S—, halogen-, and tri(hydrocarbyl)silyl-substituted hydrocarbyl; each $R^2$ is independently selected from the group consisting of hydrocarbyl, O—, N—, S—, Se—, halogen- and tri(hydrocarbyl)silyl-substituted hydrocarbyl, and O—, N—, S—, and Se-based functional groups; and each $R^4$ is independently selected from the group consisting of hydrogen, O—, N—, S—, Se—, halogen-, and tri(hydrocarbyl)silyl-substituted hydrocarbyl, and O—, N—, S—, and Se-based functional groups;
  v) optionally, a solvent; and
  provided that: if there is no solvent, then at least one of the chalcogen compound and the tin source is a liquid at room temperature; and
  if the copper source is selected from copper sulfide and copper selenide, and the tin source is selected from tin sulfide and tin selenide, then the solvent is not hydrazine.

DETAILED DESCRIPTION

Herein, the terms "solar cell" and "photovoltaic cell" are synonymous unless specifically defined otherwise. These terms refer to devices that use semiconductors to convert visible and near-visible light energy into usable electrical energy. The terms "band gap energy", "optical band gap", and "band gap" are synonymous unless specifically defined otherwise. These terms refer to the energy required to generate electron-hole pairs in a semiconductor material, which in general is the minimum energy needed to excite an electron from the valence band to the conduction band.

Herein, element groups are represented utilizing CAS notation. As used herein, the term "chalcogen" refers to Group VIA elements, and the terms "metal chalcogenides" or "chalcogenides" refer to materials that comprise metals and Group VIA elements. Suitable Group VIA elements include sulfur, selenium and tellurium. Metal chalcogenides are important candidate materials for photovoltaic applications, since many of these compounds have optical band gap values well within the terrestrial solar spectra.

Herein, the term "binary-metal chalcogenide" refers to a chalcogenide composition comprising one metal. The term "ternary-metal chalcogenide" refers to a chalcogenide composition comprising two metals. The term "quaternary-metal chalcogenide" refers to a chalcogenide composition comprising three metals. The term "multinary-metal chalcogenide" refers to a chalcogenide composition comprising two or more metals and encompasses ternary and quaternary metal chalcogenide compositions.

Herein, the terms "copper tin sulfide" and "CTS" refer to $Cu_2SnS_3$; "copper tin selenide" and "CTSe" refer to $Cu_2SnSe_3$; and "copper tin sulfide/selenide" and "CTS-Se" encompass all possible combinations of $Cu_2Sn(S,Se)_3$, including $Cu_2SnS_3$, $Cu_2SnSe_3$, and $Cu_2SnS_xSe_{3-x}$, where $0 \leq x \leq 3$. The terms "copper tin sulfide", "copper tin selenide", "copper tin sulfide/selenide", "CTS", "CTSe" and "CTS-Se" further encompass fractional stoichiometries, e.g., $Cu_{1.80}Sn_{1.05}S_3$. That is, the stoichiometry of the elements can vary from a strictly 2:1:3 molar ratio.

Herein, the terms copper zinc tin sulfide and "CZTS" refer to $Cu_2ZnSnS_4$; copper zinc tin selenide and "CZTSe" refer to $Cu_2ZnSnSe_4$; and copper zinc tin sulfide/selenide and "CZTS-Se" encompass all possible combinations of $Cu_2ZnSn(S,Se)_4$, including $Cu_2ZnSnS_4$, $Cu_2ZnSnSe_4$, and $Cu_2ZnSnS_xSe_{4-x}$, where $0 \leq x \leq 4$. The terms "CZTS," "CZTSe," and "CZTS-Se" further encompass copper zinc tin sulfide/selenide semiconductors with fractional stoichiometries, e.g., $Cu_{1.94}Zn_{0.63}Sn_{1.3}S_4$. That is, the stoichiometry of the elements can vary from a strictly 2:1:1:4 molar ratio. Materials designated as CTS-Se and CZTS-Se may also contain small amounts of other elements such as sodium. To date, the highest efficiencies have been measured for copper-poor CZTS-Se solar cells, where by "copper-poor" it is understood that the ratio Cu/(Zn+Sn) is less than 1.0. For high efficiency devices, a molar ratio of zinc to tin is greater than one is also desirable.

The term "kesterite" is commonly used to refer to materials belonging to the kesterite family of minerals and is also the common name of the mineral CZTS. As used herein, the term "kesterite" refers to crystalline compounds in either the I4– or I4-2m space groups having the nominal formula $Cu_2ZnSn(S—Se)_4$, and also "atypical kesterites" wherein zinc has replaced a fraction of the copper or copper has replaced a fraction of the zinc to give $Cu_cZn_zSn(S—Se)_4$ wherein c is greater than two and z is less than one; or c is less than two and z is greater than one. The term "kesterite structure" refers to the structure of these compounds. X-ray absorption spectroscopy (XAS) reveals spectral features unique to the kesterite form and allows for determination of the ratio of Cu to Zn in the kesterite phase. This allows for the identification of atypical kesterite compositions, which are clearly distinguished from a mixture of separate sulfide phases producing the same elemental ratios in aggregate. Control of stoichiometry in this phase allows for control of electronic properties for improved performance in a photovoltaic device.

As used herein, "coherent domain size" refers to the size of crystalline domains over which a defect-free, coherent structure may exist. The coherency comes from the fact that the three-dimensional ordering is not broken inside of these domains.

Herein, the term "metal salts" refers to compositions wherein metal cations and inorganic anions are joined by ionic bonding. Relevant classes of inorganic anions comprise oxides, sulfides, carbonates, sulfates and halides. Herein, the term "metal complexes" refers to compositions wherein a metal is bonded to a surrounding array of molecules or anions, typically called "ligands" or "complexing agents". The atom within a ligand that is directly bonded to the metal atom or ion is called the "donor atom" and, herein, often comprises nitrogen, oxygen, selenium, or sulfur.

Herein, ligands are classified according to the "Covalent Bond Classification (CBC) Method" (Green, M. L. H. *J. Organomet. Chem.* 1995, 500, 127-148). An "X-function ligand" is one which interacts with a metal center via a normal 2-electron covalent bond, composed of 1 electron from the metal and 1 electron from the X ligand. Simple examples of X-type ligands include alkyls and thiolates. Herein, the term "nitrogen-, oxygen-, carbon-, sulfur-, and selenium-based organic ligands" refers specifically to carbon-containing X-function ligands, wherein the donor atom comprises nitrogen, oxygen, carbon, sulfur, or selenium. Herein, the term "complexes of nitrogen-, oxygen-, carbon-, sulfur-, and selenium-based organic ligands" refers to the metal complexes comprising these ligands. Examples include metal complexes of amidos, alkoxides, acetylacetonates, acetates, carboxylates, hydrocarbyls, O—, N—, S—, Se—, and halogen-substituted hydrocarbyls, thiolates, selenolates, thiocarboxylates, selenocarboxylates, dithiocarbamates, and diselenocarbamates.

As defined herein, a "hydrocarbyl group" is a univalent group containing only carbon and hydrogen. Examples of hydrocarbyl groups include unsubstituted alkyls, cycloalkyls, and aryl groups, including alkyl-substituted aryl groups. Suitable hydrocarbyl groups and alkyl groups contain 1 to about 30 carbons, or 1 to 25, 1 to 20, 1 to 15, 1 to 10, 1 to 5, 1 to 4, or 1 to 2 carbons. By "heteroatom-substituted hydrocarbyl" is meant a hydrocarbyl group that contains one or more heteroatoms wherein the free valence is located on carbon, not on the heteroatom. Examples include hydroxyethyl and carbomethoxyethyl. Suitable heteroatom substituents include O—, N—, S—, halogen-, and tri(hydrocarbyl)silyl. In a substituted hydrocarbyl, all of the hydrogens may be substituted, as in trifluoromethyl. Herein, the term "tri(hydrocarbyl)silyl" encompasses silyl substituents, wherein the substituents on silicon are hydrocarbyls. Herein, by "O—, N—, S—, and Se-based functional groups" is meant univalent groups other than hydrocarbyl and substituted hydrocarbyl that comprise O—, N—, S—, or Se-heteroatoms, wherein the free valence is located on this heteroatom. Examples of O—, N—, S—, and Se-based functional groups include alkoxides, amidos, thiolates, and selenolates.

Ink Compositions

One aspect of this invention is an ink comprising:

i) a copper source selected from the group consisting of copper complexes of nitrogen-, oxygen-, carbon-, sulfur-, and selenium-based organic ligands, copper sulfides, copper selenides, and mixtures thereof;

ii) a tin source selected from the group consisting of tin complexes of nitrogen-, oxygen-, carbon-, sulfur-, and selenium-based organic ligands, tin hydrides, tin sulfides, tin selenides, and mixtures thereof;

iii) optionally, a zinc source selected from the group consisting of zinc complexes of nitrogen-, oxygen-, carbon-, sulfur-, and selenium-based organic ligands, zinc sulfides, zinc selenides, and mixtures thereof;

iv) optionally, a chalcogen compound selected from the group consisting of: elemental S, elemental Se, $CS_2$, $CSe_2$, CSSe, $R^1S$—Z, $R^1Se$—Z, $R^1S$—$SR^1$, $R^1Se$—$SeR^1$, $R^2C(S)$S—Z, $R^2C(Se)Se$—Z, $R^2C(Se)S$—Z, $R^1C(O)S$—Z, $R^1C(O)Se$—Z, and mixtures thereof, with each Z independently selected from the group consisting of: H, $NR^4_4$, and $SiR^5_3$; wherein each $R^1$ and $R^5$ is independently selected from the group consisting of: hydrocarbyl and O—, N—, S—, halogen- and tri(hydrocarbyl)silyl-substituted hydrocarbyl; each $R^2$ is independently selected from the group consisting of hydrocarbyl, O—, N—, S—, Se—, halogen-, and tri(hydrocarbyl)silyl-substituted hydrocarbyl, and O—, N—, S—, and Se-based functional groups; and each $R^4$ is independently selected from the group consisting of hydrogen, O—, N—, S—, Se—, halogen- and tri(hydrocarbyl)silyl-substituted hydrocarbyl, and O—, N—, S—, and Se-based functional groups;

provided that:

if there is no solvent, then at least one of the chalcogen compound and the tin source is a liquid at room temperature; and if the copper source is selected from copper sulfide and copper selenide, and the tin source is selected from tin sulfide and tin selenide, then the solvent is not hydrazine.

In some embodiments, the ratio of the total number of moles of the chalcogen compound, the sulfur- and selenium-based organic ligands, and the copper-, tin- and zinc-sulfides and selenides to the total number of moles of the copper, tin and zinc complexes is at least about 1.

In some embodiments, a chalcogen compound is present.

In some embodiments, a zinc source is present.

In some embodiments, elemental sulfur, elemental selenium, or a mixture of elemental sulfur and selenium is present, and the molar ratio of (S+Se) is about 0.2 to about 5, or about 0.5 to about 2.5, relative to the tin source.

In some embodiments, the nitrogen-, oxygen-, carbon-, sulfur- and selenium-based organic ligands are selected from the group consisting of: amidos; alkoxides; acetylacetonates; carboxylates; hydrocarbyls; O—, N—, S—, halogen-, and tri(hydrocarbyl)silyl-substituted hydrocarbyls; thio- and selenolates; thio-, seleno-, and dithiocarboxylates; dithio-, diseleno-, and thioselenocarbamates; and dithioxanthogenates.

Suitable amidos include: bis(trimethylsilyl)amino, dimethylamino, diethylamino, diisopropylamino, N-methyl-t-butylamino, 2-(dimethylamino)-N-methylethylamino, N-methylcyclohexylamino, dicyclohexylamino, N-ethyl-2-methylallylamino, bis(2-methoxyethyl)amino, 2-methylaminomethyl-1,3-dioxolane, pyrrolidino, t-butyl-1-piperazinocarboxylate, N-methylanilino, N-phenylbenzylamino, N-ethyl-o-toluidino, bis(2,2,2-trifluoromethyl)amino, N-t-butyltrimethylsilylamino, and mixtures thereof. Some ligands may chelate the metal center, and, in some cases, comprise more than one type of donor atom, e.g., the dianion of N-benzyl-2-aminoethanol is a suitable ligand comprising both amino and alkoxide groups.

Suitable alkoxides include: methoxide, ethoxide, n-propoxide, i-propoxide, n-butoxide, t-butoxide, neopentoxide, ethylene glycol dialkoxide, 1-methylcyclopentoxide, 2-fluoroethoxide, 2,2,2,-trifluoroethoxide, 2-ethoxyethoxide, 2-methoxyethoxide, 3-methoxy-1-butoxide, methoxyethoxyethoxide, 3,3-diethoxy-1-propoxide, 2-dimethylaminoethoxide, 2-diethylaminoethoxide, 3-dimethylamino-1-propoxide, 3-diethylamino-1-propoxide, 1-dimethylamino-2-propoxide, 1-diethylamino-2-propoxide, 2-(1-pyrrolidinyl)ethoxide, 1-ethyl-3-pyrrolidinoxide, 3-acetyl-1-propoxide, 4-methoxyphenoxide, 4-chlorophenoxide, 4-t-butylphenoxide, 4-cyclopentylphenoxide, 4-ethylphenoxide, 3,5-bis(trifluoromethyl)phenoxide, 3-chloro-5-methoxyphenoxide, 3,5-dimethoxyphenoxide, 2,4,6-trimethylphenoxide, 3,4,5-trimethylphenoxide, 3,4,5-trimethoxyphenoxide, 4-t-butyl-catecholate(2-), 4-propanoylphenoxide, 4-(ethoxycarbonyl)phenoxide, 3-(methylthio)-1-propoxide, 2-(ethylthio)-1-ethoxide, 2-(methylthio)ethoxide, 4-(methylthio)-1-butoxide, 3-(methylthio)-1-hexoxide, 2-methoxybenzylalkoxide, 2-(trimethylsilyl)ethoxide, (trimethylsilyl)methoxide, 1-(trimethylsilyl)ethoxide, 3-(trimethylsilyl)propoxide, 3-methylthio-1-propoxide, and mixtures thereof.

Herein, the term acetylacetonate refers to the anion of 1,3-dicarbonyl compounds, $A^1C(O)CH(A^2)C(O)A^1$, wherein each $A^1$ is independently selected from hydrocarbyl, substituted hydrocarbyl, and O—, S—, and N-based functional groups and each $A^2$ is independently selected from hydrocarbyl, substituted hydrocarbyl, halogen, and O—, S—, and N-based functional groups. Suitable acetylacetonates include: 2,4-pentanedionate, 3-methyl-2-4-pentanedionate, 3-ethyl-2,4-pentanedionate, 3-chloro-2,4-pentanedionate, 1,1,1-trifluoro-2,4-pentanedionate, 1,1,1,5,5,5-hexafluoro-2,4-pentanedionate, 1,1,1,5,5,6,6,6,-octafluoro-2,4-hexanedionate, ethyl 4,4,4-trifluoroacetoacetate, 2-methoxyethylacetoacetate, methylacetoacetate, ethylacetoacetate, t-butylacetoacetate, 1-phenyl-1,3-butanedionate, 2,2,6,6-tetramethyl-3,5-heptanedionate, allyloxyethoxytrifluoroacetoacetate, 4,4,4-trifluoro-1-phenyl-1,3-butanedionate, 1,3-diphenyl-1,3-propanedionate, 6,6,7,7,8,8,8,-heptafluoro-2-2-dimethyl-3,5-octanedionate, and mixtures thereof.

Suitable carboxylates include: acetate, trifluoroacetate, propionate, butyrates, hexanoate, octanoate, decanoate, stearate, isobutyrate, t-butylacetate, heptafluorobutyrate, methoxyacetate, ethoxyacetate, methoxypropionate, 2-ethylhexanoate, 2-(2-methoxyethoxy)acetate, 2-[2-(2-methoxyethoxy)ethoxy]acetate, (methylthio)acetate, tetrahydro-2-furoate, 4-acetyl butyrate, phenylacetate, 3-methoxyphenylacetate, (trimethylsilyl)acetate, 3-(trimethylsilyl)propionate, maleate, benzoate, acetylenedicarboxylate, and mixtures thereof.

Suitable hydrocarbyls include: methyl, ethyl, n-propyl, i-propyl, n-butyl, i-butyl, sec-butyl, t-butyl, n-pentyl, n-hexyl, n-heptyl, n-octyl, neopentyl, 3-methylbutyl, phenyl, benzyl, 4-t-butylbenzyl, 4-t-butylphenyl, p-tolyl, 2-methyl-2-phenylpropyl, 2-mesityl, 2-phenylethyl, 2-ethylhexyl, 2-methyl-2-phenylpropyl, 3,7-dimethyloctyl, allyl, vinyl, cyclopentyl, cyclohexyl, and mixtures thereof.

Suitable O—, N—, S—, halogen- and tri(hydrocarbyl)silyl-substituted hydrocarbyls include: 2-methoxyethyl, 2-ethoxyethyl, 4-methoxyphenyl, 2-methoxybenzyl, 3-methoxy-1-butyl, 1,3-dioxan-2-ylethyl, 3-trifluoromethoxyphenyl, 3,4-(methylenedioxy)phenyl, 2,4-dimethoxyphenyl, 2,5-dimethoxyphenyl, 3,4-dimethoxyphenyl, 2-methoxybenzyl, 3-methoxybenzyl, 4-methoxybenzyl, 3,5-dimethoxyphenyl, 3,5-dimethyl-4-methoxyphenyl, 3,4,5-trimethoxyphenyl, 4-methoxyphenethyl, 3,5-dimethoxybenzyl, 4-(2-tetrahydro-2H-pyranoxy)phenyl, 4-phenoxyphenyl, 2-benzyloxyphenyl, 3-benzyloxyphenyl, 4-benzyloxyphenyl, 3-fluoro-4-methoxyphenyl, 5-fluoro-2-methoxyphenyl, 2-ethoxyethenyl, 1-ethoxyvinyl, 3-methyl-2-butenyl, 2-furyl, carbomethoxyethyl, 3-dimethylamino-1-propyl, 3-diethylamino-1-propyl, 3-[bis(trimethylsilyl)amino]phenyl, 4-(N,N-dimethyl)aniline, [2-(1-pyrrolidinylmethyl)phenyl], [3-(1-pyrrolidinylmethyl)phenyl], [4-(1-pyrrolidinylmethyl) phenyl], [2-(4-morpholinylmethyl)phenyl], [3-(4-morpholinylmethyl)phenyl], [4-(4-morpholinylmethyl)phenyl], (4-(1-piperidinylmethyl)phenyl), (2-(1-piperidinylmethyl) phenyl), (3-(1-piperidinylmethyl)phenyl), 3-(1,4-dioxa-8-azaspiro[4,5]dec-8-ylmethyl)phenyl, 1-methyl-2-pyrrolyl, 2-fluoro-3-pyridyl, 6-methoxy-2-pyrimidyl, 3-pyridyl, 5-bromo-2-pyridyl, 1-methyl-5-imidazolyl, 2-chloro-5-pyrimidyl, 2,6-dichloro-3-pyrazinyl, 2-oxazolyl, 5-pyrimidyl, 2-pyridyl, 2-(ethylthio)ethyl, 2-(methylthio)ethyl, 4-(methylthio)butyl, 3-(methylthio)-1-hexyl, 4-thioanisole, 4-bromo-2-thiazolyl, 2-thiophenyl, chloromethyl, 4-fluorophenyl, 3-fluorophenyl, 4-chlorophenyl, 3-chlorophenyl, 4-fluoro-3-methylphenyl, 4-fluoro-2-methylphenyl, 4-fluoro-3-methylphenyl, 5-fluoro-2-methylphenyl, 3-fluoro-2-methylphenyl, 4-chloro-2-methylphenyl, 3-fluoro-4-methylphenyl, 3,5-bis(trifluoromethyl)-phenyl, 3,4,5-trifluorophenyl, 3-chloro-4-fluorophenyl, 3-chloro-5-fluorophenyl, 4-chloro-3-fluorophenyl, 3,4-dichlorophenyl, 3,5-dichlorophenyl, 3,4-difluorophenyl, 3,5-difluorophenyl, 2-bromobenzyl, 3-bromobenzyl, 4-fluorobenzyl, perfluoroethyl, 2-(trimethylsilyl)ethyl, (trimethylsilyl)methyl, 3-(trimethylsilyl)propyl, and mixtures thereof.

Suitable thio- and selenolates include: 1-thioglycerol, phenylthio, ethylthio, methylthio, n-propylthio, i-propylthio, n-butylthio, i-butylthio, t-butylthio, n-pentylthio, n-hexylthio, n-heptylthio, n-octylthio, n-nonylthio, n-decylthio, n-dodecylthio, 2-methoxyethylthio, 2-ethoxyethylthio, 1,2-ethanedithiolate, 2-pyridinethiolate, 3,5-bis(trifluoromethyl) benzenethiolate, toluene-3,4-dithiolate, 1,2-benzenedithiolate, 2-dimethylaminoethanethiolate, 2-diethylaminoethanethiolate, 2-propene-1-thiolate, 2-hydroxythiolate, 3-hydroxythiolate, methyl-3-mercaptopropionate anion, cyclopentanethiolate, 2-(2-methoxyethoxy) ethanethiolate, 2-(trimethylsilyl)ethanethiolate, pentafluorophenylthiolate, 3,5-dichlorobenzenethiolate, phenylthiolate, cyclohexanethiolate, 4-chlorobenzenemethanethiolate, 4-fluorobenzenemethanethiolate, 2-methoxybenzenethiolate, 4-methoxybenzenethiolate, benzylthiolate, 3-methylbenzylthiolate, 3-ethoxybenzenethiolate, 2,5-dimethoxybenzenethiolate, 2-phenylethanethiolate, 4-t-butylbenzenethiolate, 4-t-butylbenzylthiolate, phenylselenolate, methylselenolate, ethylselenolate, n-propylselenolate, propylselenolate, n-butylselenolate, i-butylselenolate, t-butylselenolate, pentylselenolate, hexylselenolate, octylselenolate, benzylselenolate, and mixtures thereof.

Suitable thio-, seleno-, and dithiocarboxylates include: thioacetate, thiobenzoate, selenobenzoate, dithiobenzoate, and mixtures thereof.

Suitable dithio-, diseleno-, and thioselenocarbamates include: dimethyldithiocarbamate, diethyldithiocarbamate, dipropyldithiocarbamate, dibutyldithiocarbamate, bis(hydroxyethyl)dithiocarbamate, dibenzyldithiocarbamate, dimethyldiselenocarbamate, diethyldiselenocarbamate, dipropyldiselenocarbamate, dibutyldiselenocarbamate, dibenzyldiselenocarbamate, and mixtures thereof.

Suitable dithioxanthogenates include: methylxanthogenate, ethylxanthogenate, i-propylxanthogenate, and mixtures thereof.

For the chalcogen compounds, suitable $R^1S$— and $R^1Se$— of $R^1S$—Z and $R^1Se$—Z are selected from the above list of suitable thio- and selenolates.

For the chalcogen compounds, suitable $R^1S$—$SR^1$, $R^1Se$—$SeR^1$ include: dimethyldisulfide, 2,2'-dipyridyldisulfide, di(2-thienyl)disulfide, bis(2-hydroxyethyl)disulfide, bis (2-methyl-3-furyl)disulfide, bis(6-hydroxy-2-naphthyl)disulfide, diethyldisulfide, methylpropyldisulfide, diallyldisulfide, dipropyldisulfide, isopropyldisulfide, dibutyldisulfide, sec-butyldisulfide, bis(4-methoxyphenyl)disulfide, dibenzyldisulfide, p-tolyldisulfide, phenylacetyldisulfide, tetramethylthiuram disulfide, tetraethylthiuram disulfide, tetrapropylthiuram disulfide, tetrabutylthiuram disulfide, methylxanthic disulfide, ethylxanthic disulfide, i-propylxanthic disulfide, dibenzyldiselenide, dimethyldiselenide, diphenyldiselenide, and mixtures thereof.

For the chalcogen compounds, suitable $R^2C(S)S$—Z, $R^2C(Se)Se$—Z, $R^2C(Se)S$—Z, $R^1C(O)S$—Z, and $R^1C(O)Se$—Z are selected from the above lists of suitable thio-, seleno-, and dithiocarboxylates; suitable dithio-, diseleno-, and thioselenocarbamates; and suitable dithioxanthogenates.

Suitable $NR^4_4$ include: $Et_2NH_2$, $Et_4N$, $Et_3NH$, $EtNH_3$, $NH_4$, $Me_2NH_2$, $Me_4N$, $Me_3NH$, $MeNH_3$, $Pr_2NH_2$, $Pr_4N$, $Pr_3NH$, $PrNH_3$, $Bu_3NH$, $Me_2PrNH$, $(i-Pr)_3NH$, and mixtures thereof.

Suitable $SiR^5_3$ include: $SiMe_3$, $SiEt_3$, $SiPr_3$, $SiBu_3$, $Si(i-Pr)_3$, $SiEtMe_2$, $SiMe_2(i-Pr)$, $Si(t-Bu)Me_2$, $Si(cyclohexyl)Me_2$, and mixtures thereof.

Many of these ligands and chalcogen compounds are commercially available or readily synthesized by the addition of an amine, alcohol, or alkyl nucleophile to $CS_2$ or $CSe_2$ or $CSSe$.

Components and by-products of the ink may be liquids at room temperature or at the heating temperature and coating temperature. In such cases, the ink need not comprise a solvent. In some embodiments, a chalcogen compound is present and is a liquid at room temperature. In other embodiments, the tin source is a liquid at room temperature. In yet other embodiments, a chalcogen compound is present and is a liquid at room temperature and the tin source is a liquid at room temperature.

In some embodiments, a solvent is present and the boiling point of the solvent is greater than about 100° C. or 110° C. or 120° C. or 130° C. or 140° C. or 150° C. or 160° C. or 170° C. or 180° C. or 190° C. at atmospheric pressure. In some embodiments, the process is conducted at atmospheric pressure. Suitable solvents include: aromatics, heteroaromatics, nitriles, amides, alcohols, pyrrolidinones, amines, and mixtures thereof. Suitable heteroaromatics include pyridine and substituted pyridines. Suitable amines include compounds of the form $R^6NH_2$, wherein each $R^6$ is independently selected from the group consisting of: O—, N—, S—, and Se-substituted hydrocarbyl. In some embodiments, the solvent comprises an amino-substituted pyridine. In some embodiments, the solvent comprises about 95 to about 5 wt %, or 90 to 10 wt %, or 80 to 20 wt %, or 70 to 30 wt %, or 60 to 40 wt % of the ink, based upon the total weight of the ink.

Suitable aromatic solvents include: benzene, toluene, ethylbenzene, chlorobenzene, o-xylene, m-xylene, p-xylene, mesitylene, i-propylbenzene, 1-chlorobenzene, 2-chlorotoluene, 3-chlorotoluene, 4-chlorotoluene, t-butylbenzene, n-butylbenzene, i-butylbenzene, s-butylbenzene, 1,2-dichlorobenzene, 1,3-dichlorobenzene, 1,4-dichlorobenzene, 1,3-diisopropylbenzene, 1,4-diisopropylbenzene, 1,2-difluorobenzene, 1,2,4-trichlorobenzene, 3-methylanisole, 3-chloroanisole, 3-phenoxytoluene, diphenylether, and mixtures thereof.

Suitable heteroaromatic solvents include: pyridine, 2-picoline, 3-picoline, 3,5-lutidine, 4-t-butylpyridine, 2-aminopyridine, 3-aminopyridine, diethylnicotinamide, 3-cyanopyridine, 3-fluoropyridine, 3-chloropyridine, 2,3-dichloropyridine, 2,5-dichloropyridine, 5,6,7,8-tetrahydroisoquinoline, 6-chloro-2-picoline, 2-methoxypyridine, 3-(aminomethyl)pyridine, 2-amino-3-picoline, 2-amino-6-picoline, 2-amino-2-chloropyridine, 2,3-diaminopyridine, 3,4-diaminopyridine, 2-(methylamino) pyridine, 2-dimethylaminopyridine, 2-(aminomethyl)pyridine, 2-(2-aminoethyl)pyridine, 2-methoxypyridine, 2-butoxypyridine, and mixtures thereof.

Suitable nitrile solvents include: acetonitrile, 3-ethoxypropionitrile, 2,2-diethoxypropionitrile, 3,3-diethoxypropionitrile, diethoxyacetonitrile, 3,3-dimethoxypropionitrile, 3-cyanopropionaldehyde dimethylacetal, dimethylcyanamide, diethylcyanamide, diisopropylcyanamide, 1-pyrrolidinecarbonitrile, 1-piperidinecarbonitrile, 4-morpholinecarbonitrile, methylaminoacetonitrile, butylaminoacetonitrile, dimethylaminoacetonitrile, diethylaminoacetonitrile, N-methyl-beta-alaninenitrile, 3,3'-iminopropionitrile, 3-(dimethylamino)propionitrile, 1-piperidinepropionitrile, 1-pyrrolidinebutyronitrile, propionitrile, butyronitrile, valeronitrile, isovaleronitrile, 3-methoxypropionitrile, 3-cyanopyridine, 4-amino-2-chlorobenzonitrile, 4-acetylbenzonitrile, and mixtures thereof.

Suitable amide solvents include: N,N-diethylnicotinamide, N-methylnicotinamide, N,N-dimethylformamide, N,N-diethylformamide, N,N-diisopropylformamide, N,N-dibutylformamide, N,N-dimethylacetamide, N,N-diethylacetamide, N,N-diisopropylacetamide, N,N-dimethylpropionamide, N,N-diethylpropionamide, N,N,2-trimethylpropionamide, acetamide, propionamide, isobutyramide, trimethylacetamide, nipecotamide, N,N-diethylnipecotamide, and mixtures thereof.

Suitable alcohol solvents include: methoxyethoxyethanol, methanol, ethanol, isopropanol, 1-butanol, 2-pentanol, 2-hexanol, 2-octanol, 2-nonanol, 2-decanol, 2-dodecanol, ethylene glycol, 1,3-propanediol, 2,3-butanediol, 1,5-pentanediol, 1,6-hexanediol, 1,7-heptanediol, 1,8-octanediol, cyclopentanol, cyclohexanol, cyclopentanemethanol, 3-cyclopentyl-1-propanol, 1-methylcyclopentanol, 3-methylcyclopentanol, 1,3-cyclopentanediol, 2-cyclohexylethanol, 1-cyclohexylethanol, 2,3-dimethylcyclohexanol, 1,3-cyclohexanediol, 1,4-cyclohexanediol, cycloheptanol, cyclooctanol, 1,5-decalindiol, 2,2-dichloroethanol, 2,2,2-trifluoroethanol, 2-methoxyethanol, 2-ethoxyethanol, 2-propoxyethanol, 2-butoxyethanol, 3-ethoxy-1-propanol, propyleneglycol propyl ether, 3-methoxy-1-butanol, 3-methoxy-3-methyl-1-butanol, 3-ethoxy-1,2-propanediol, di(ethyleneglycol) ethylether, diethylene glycol, 2,4-dimethylphenol, and mixtures thereof.

Suitable pyrrolidinone solvents include: N-methyl-2-pyrrolidinone, 5-methyl-2-pyrrolidinone, 3-methyl-2-pyrrolidinone, 2-pyrrolidinone, 1,5-dimethyl-2-pyrrolidinone, 1-ethyl-2-pyrrolidinone, 1-(2-hydroxyethyl)-2-pyrrolidinone, 5-methoxy-2-pyrrolidinone, 1-(3-aminopropyl)-2-pyrrolidinone, and mixtures thereof.

Suitable amine solvents include: butylamine, hexylamine, octylamine, 3-methoxypropylamine, 2-methylbutylamine, isoamylamine, 1,2-dimethylpropylamine, hydrazine, ethylenediamine, 1,3-diaminopropane, 1,2-diaminopropane, 1,2-diamino-2-methylpropane, 1,3-diaminopentane, 1,1-dimethylhydrazine, N-ethylmethylamine, diethylamine, N-methylpropylamine, diisopropylamine, dibutylamine, triethylamine, N-methylethylenediamine, N-ethylethylenediamine, N-propylethylenediamine, N-isopropylethylenediamine, N,N'-dimethylethylenediamine, N,N-dimethylethylenediamine, N,N'-diethylethylenediamine, N,N-diethylethylenediamine, N,N-diisopropylethylenediamine, N,N-dibutylethylenediamine, N,N,N'-trimethylethylenediamine, 3-dimethylaminopropylamine, 3-diethylaminopropylamine, diethylenetriamine, cyclohexylamine, bis(2-methoxyethyl)amine, aminoacetaldehyde diethyl acetal, methylaminoacetaldehyde dimethyl acetal, N,N-dimethylacetamide dimethyl acetal, dimethylaminoacetaldehyde diethyl acetal, diethylaminoacetaldehyde diethyl acetal, 4-aminobutyraldehyde diethyl acetal, 2-methylaminomethyl-1,3-dioxolane, ethanolamine, 3-amino-1-propanol, 2-hydroxyethylhydrazine, N,N-diethylhydroxylamine, 4-amino-1-butanol, 2-(2-aminoethoxy)ethanol, 2-(methylamino)ethanol, 2-(ethylamino)ethanol, 2-(propylamino)ethanol, diethanolamine, diisopropanolamine, N,N-dimethylethanolamine, N,N-diethylethanolamine, 2-(dibutylamino)ethanol, 3-dimethylamino-1-propanol, 3-diethylamino-1-propanol, 1-dimethylamino-2-propanol, 1-diethylamino-2-propanol, N-methyldiethanolamine, N-ethyldiethanolamine, 3-amino-1,2-propanediol, and mixtures thereof.

In some embodiments, the ink comprises up to about 10 wt % or 7.5 wt % or 5 we/0 or 2.5 wt % or 1 wt % of one or more additives selected from the group consisting of: dispersants, surfactants, polymers, binders, ligands, capping agents, defoamers, thickening agents, corrosion inhibitors, plasticizers, and dopants. Suitable dopants include sodium and alkali-containing compounds selected from the group consisting of: alkali compounds comprising nitrogen-, oxygen-, carbon-, sulfur-, or selenium-organic ligands, alkali sulfides, alkali selenides, and mixtures thereof. In other embodiments, the dopant comprises an alkali-containing compound selected from the group consisting of: alkali-compounds comprising amidos; alkoxides; acetylacetonates; carboxylates; hydrocarbyls; O—, N—, S—, halogen-, and tri(hydrocarbyl)silyl-substituted hydrocarbyls; thio- and selenolates; thio-, seleno-, and dithiocarboxylates; dithio-, diseleno-, and thioselenocarbamates; and dithioxanthogenates.

In some embodiments, the ink comprises one or more binders or surfactants selected from the group consisting of: decomposable binders; decomposable surfactants; cleavable surfactants; surfactants with a boiling point less than about 250° C.; and mixtures thereof. Suitable decomposable binders include: homo- and co-polymers of polyethers; homo- and co-polymers of polylactides; homo- and co-polymers of polycarbonates; homo- and co-polymers of poly[3-hydroxybutyric acid]; homo- and co-polymers of polymethacrylates; and mixtures thereof.

In some embodiments, the molar ratio of copper to tin is about 2:1 in the ink. In other embodiments, zinc is present in the ink and the molar ratio of copper to zinc to tin is about 2:1:1 in the ink.

Preparing the ink typically comprises mixing the components (i)-(v) by any conventional method. If one or more of the copper-, tin-, zinc-, or chalcogen sources is a liquid at room temperature or at the processing temperatures, the use of a separate solvent is optional. Otherwise, a solvent is used. In some embodiments, the ink is a solution; in other embodiments, the ink is a suspension or dispersion. Typically, the preparation is conducted under an inert atmosphere, taking precautions to protect the reaction mixtures from air and light.

In some embodiments, the ink is prepared at low temperatures, e.g., when low boiling point and/or highly reactive reagents such as $CS_2$ and $ZnEt_2$ are utilized. In such cases, the ink is typically stirred for 48 hours or longer at room temperature prior to heat processing. In some embodiments, the ink is prepared at about 20-100° C., e.g., when the reagents are solids or have high boiling points and/or when one or more of the solvents is a solid at room temperature, e.g., 2-aminopyridine or 3-aminopyridine. In some embodiments, all of the ink components are added together at room temperature. In some embodiments, elemental chalcogen is added last, following the mixing of all the other components for about half an hour at room temperature. In some embodiments, the components are added consecutively. For example, all of the reagents except copper can be mixed and heated at about 100° C. prior to addition of the copper source, or all of the reagents except tin can be mixed and heated at about 100° C. prior to the addition of the tin source.

In some embodiments two or more inks are prepared, with each ink comprising a complete set of reagents, e.g., each ink comprises at least a zinc source, a copper source, and a tin source for inks useful for forming CZTS-Se. The two or more inks can then be combined following mixing or following heat-processing. This method is especially useful for controlling stoichiometry and obtaining CTS-Se or CZTS-Se of high purity, as prior to mixing, separate films from each ink can be coated, annealed, and analyzed by XRD. The XRD results can guide the selection of the type and amount of each ink to be combined. For example, an ink yielding an annealed film of CZTS-Se with traces of copper sulfide and zinc sulfide can be combined with an ink yielding an annealed film of CZTS-Se with traces of tin sulfide, to form an ink that yields an annealed film comprising only CZTS-Se, as determined by XRD.

In some embodiments, the ink is heat-processed at a temperature of greater than about 100° C. or 110° C. or 120° C. or 130° C. or 140° C. or 150° C. or 160° C. or 170° C. or 180° C. or 190° C. before coating on the substrate. Suitable heating methods include conventional heating and microwave heating. In some embodiments, it has been found that this heat-processing step aids the formation of CZTS-Se, with XAS analysis of films formed from heat-processed inks indicating the presence of kesterite upon heating the films at heating temperatures as low as 120° C. This optional heat-processing step is typically carried out under an inert atmosphere. The ink produced at this stage can be stored for extended periods (e.g., a couple of months) without any noticeable decrease in efficacy.

The inks of this invention can be used to form CTS-Se or CZTS-Se layers on a substrate. Typically, the ink is coated onto the substrate by conventional means and then dried by applying a vacuum, by evaporation or by heating at a temperature from 80-350° C. Suitable substrates include metal foils, plastics, polymers, metalized plastics, glass, solar glass, low-iron glass, green glass, soda-lime glass, steel, stainless steel, aluminum, ceramics, metal plates, metalized ceramic plates, and metalized polymer plates.

For some inks, it has been found that CZTS-Se is formed during this heating step, with XAS analysis indicating the presence of kesterite.

More typically, the dried, coated substrate is annealed by heating the substrate at about 350° C. to about 800° C. The annealing step can be carried out under an inert atmosphere, provided that the ratio of the total number of moles of the chalcogen compound, the sulfur- and selenium-based organic ligands, and the copper-, tin- and zinc-sulfides and selenides to the total number of moles of the copper, tin and zinc complexes is at least about 1. Alternatively, the annealing step can be carried out in an atmosphere comprising an inert gas and reactive component selected from the group consisting of: selenium vapor, sulfur vapor, hydrogen, hydrogen sulfide, hydrogen selenide, and mixtures thereof. Typically, at least a portion of the chalcogen can be exchanged (e.g., S can be replaced by Se) by conducting the annealing step in the presence of selenium vapor or hydrogen selenide.

It has been found that CTS-Se and/or CZTS-Se can be formed in high yield during the annealing step, as determined by XRD or XAS. In some embodiments, annealed films consist essentially of CTS-Se or CZTS-Se, according to XRD analysis.

CZTS-Se can serve as the absorber layer in a photovoltaic cell. A CZTS-Se-based photovoltaic cell can be made by forming the CZTS-Se layer on a photovoltaic substrate (e.g., Mo-coated SLG) and then depositing a buffer layer, a transparent top contact layer, electrode pads, and an antireflective layer in sequence onto the annealed CZTS layer. Except for the absorber layer, the same materials and processes used to assemble a CIGS-based photovoltaic cell can be used to assemble a CZTS-Se-based photovoltaic cell.

EXAMPLES

General

Materials. All reagents were purchased from Aldrich (Milwaukee, Wis.), Alfa Aesar (Ward Hill, Mass.), TCI (Portland, Oreg.), or Gelest (Morrisville, Pa.). Solid reagents were used without further purification. Liquid reagents that were not packaged under an inert atmosphere were degassed by bubbling argon through the liquid for 1 hr. Anhydrous solvents were used for the preparation of all formulations and for all cleaning procedures carried out within the drybox. Solvents were either purchased as anhydrous from Aldrich or Alfa Aesar, or purified by standard methods (e.g., Pangborn, A. G., et. al. *Organometallics,* 1996, 15, 1518-1520) and then stored in the drybox over activated molecular sieves.

Formulation and Coating Preparations. Substrates (SLG slides) were cleaned sequentially with aqua regia, Miilipore® water and isopropanol, dried at 110° C., and coated on the non-float surface of the SLG substrate. All formulations and coatings were prepared in a nitrogen-purged drybox. Vials containing formulations were heated and stirred on a magnetic hotplate/stirrer. Coatings were dried in the drybox.

Slide Preparation: In some instances, SLG slides were treated with 3-(mercaptopropyl)-trimethoxysilane. ~100 mL of 3-(mercaptopropyl)-trimethoxysilane and ~1 mL of 2-(2-methoxyethoxy)acetic acid were mixed in a glass bottle in the drybox. SLG slides and Mo-patterned SLG slides were soaked in this solution for more than 24 hr. Next, the slides were soaked in methylene chloride for ~0.5 hr, rinsed with MeOH, and then dried with a wipe.

Annealing of Coated Substrates in a Tube Furnace. Annealings were carried out either under a nitrogen, nitrogen/sulfur, or nitrogen/selenium atmosphere. Annealings under a nitrogen atmosphere were carried out in either a single-zone Lindberg/Blue (Ashville, N.C.) tube furnace equipped with an external temperature controller and a one-inch quartz tube, or in a Lindberg/Blue three-zone tube furnace (Model STF55346C) equipped with a three-inch quartz tube. A gas inlet and outlet were located at opposite ends of the tube, and the tube was purged with nitrogen while heating and cooling. The coated substrates were placed on quartz plates inside of the tube.

Annealings under a nitrogen/sulfur atmosphere were carried out in the single-zone furnace in the one-inch tube. A 3-inch long ceramic boat was loaded with 2.5 g of elemental sulfur and placed near the nitrogen inlet, outside of the direct heating zone. The coated substrates were placed on quartz plates inside the tube. In the following Examples, annealings were carried out under a nitrogen/sulfur atmosphere, unless noted otherwise.

Prior to selenization, samples were first annealed under a nitrogen-purge in the three-inch tube in the three-zone furnace. Then, the samples were placed in a 5"×1.4"×1" graphite box with ⅛" walls that was equipped with a lid with a lip and a 1 mm hole in the center. Each graphite box was equipped with two ceramic boats (0.984"×0.591"×0.197") at each end, containing 0.1 g of selenium. The graphite box was then place in a two-inch tube, with up to two graphite boxes per tube. House vacuum was applied to the tube for 10-15 min, followed by a nitrogen purge for 10-15 min. This process was carried out three times. The tube containing the graphite boxes was then heated in the single-zone furnace with both heating and cooling carried out under a nitrogen purge.

Rapid Thermal Annealing (RTA). A MILA-5000 Infrared Lamp Heating System by ULVAC-RICO Inc. (Methuen, Mass.) was used for heating and the system was cooled using a Polyscience (Niles, Ill.) recirculating bath held at 15° C. Samples were heated under nitrogen purge as follows: 20° C. for 10 min; ramp to 400° C. in 1 min; hold at 400° C. for 2 min; cool to 20° C. during ~30 min.

Details of the Procedures Used for Device Manufacture

Mo-Sputtered Substrates. Substrates for photovoltaic devices were prepared by coating a SLG substrate with a 500 nm layer of patterned molybdenum using a Denton Sputtering System. Deposition conditions were: 150 watts of DC Power, 20 sccm Ar, and 5 mT pressure.

Cadmium Sulfide Deposition. 12.5 mg $CdSO_4$ (anhydrous) was dissolved in a mixture of nanopure water (34.95 mL) and 28% $NH_4OH$ (4.05 mL). Then a 1 mL aqueous solution of 22.8 mg thiourea was added rapidly to form the bath solution. Immediately upon mixing, the bath solution was poured into a double-walled beaker (with 70° C. water circulating between the walls), which contained the samples to be coated. The solution was continuously stirred with a magnetic stir bar. After 23 minutes, the samples were taken out, rinsed with and then soaked in nanopure water for an hour. The samples were dried under a nitrogen stream and then annealed under a nitrogen atmosphere at 200° C. for 2 minutes.

Insulating ZnO and AZO Deposition. A transparent conductor was sputtered on top of the CdS with the following structure: 50 nm of insulating ZnO (150 W RF, 5 mTorr, 20 sccm) followed by 500 nm of Al-doped ZnO using a 2% $Al_2O_3$, 98% ZnO target (75 or 150 W RF, 10 mTorr, 20 sccm).

ITO Transparent Conductor Deposition. A transparent conductor was sputtered on top of the CdS with the following structure: 50 nm of insulating ZnO [100 W RF, 20 mTorr (19.9 mTorr Ar+0.1 mTorr $O_2$)] followed by 250 nm of ITO [100 W RF, 12 mTorr (12 mTorr Ar+5×10$^{-6}$ Torr $O_2$)]. The sheet resistivity of the resulting ITO layer is around 30 ohms per square.

Deposition of Silver Lines. Silver was deposited at 150 WDC, 5 mTorr, 20 sccm Ar, with a target thickness of 750 nm.

Details of X-ray. IV, EQE, and OBIC Analysis.

XAS Analysis. XANES spectroscopy at the Cu, Zn and Sn K-edges were carried out at the Advanced Photon Source at the Argonne National Laboratory. Data were collected in fluorescence geometry at beamline 5BMD, DND-CAT. Thin film samples were presented to the incident x-ray beam as made. An Oxford spectroscopy-grade ion chamber was used to determine the X-ray incident intensity ($I_0$). The $I_0$ detector was filled with 570 Torr of $N_2$ and 20 Torr of Ar. The fluorescence detector was a Lytle Cell filled with Xe installed perpendicular to the beam propagation direction. Data were collected from 8879 eV to 9954 eV for the Cu edge. The high final energy was used in order to capture a portion of the Zn edge in the same data set, to allow edge step ratio determination as an estimate of Cu:Zn ratio in the film. The Zn edge data were collected over the range 9557 eV to 10,404 eV. Sn edge data covered the range of 29,000 eV to 29,750 eV. The data energy scales were calibrated based on data from metal reference foils collected prior to sample data collection. A second order background was subtracted and the spectra were normalized. Data from several Cu, Zn and Sn sulfide and oxide standards ($Cu_2ZnSnS_4$, $Cu_2SnS_3$, CuS, $Cu_2S$, CuO, $Cu_2O$, ZnS, ZnO, SnS, SnO and $SnO_2$) were obtained under the same conditions. Non-linear least squares fitting of a linear combination of the appropriate standards to the spectra obtained from the samples yielded the phase distribution for each element.

XRD Analysis. Powder X-ray diffraction was used for the identification of crystalline phases. Data were obtained with a Philips X'PERT automated powder diffractometer, Model 3040. The diffractometer was equipped with automatic variable anti-scatter and divergence slits, X'Celerator RTMS detector, and Ni filter. The radiation was CuK(alpha) (45 kV, 40 mA). Data were collected at room temperature from 4 to 120°. 2-theta; using a continuous scan with an equivalent step size of 0.02°; and a count time of from 80 sec to 240 sec per step in theta-theta geometry. Thin film samples were presented to the X-ray beam as made. MDI/Jade software version 9.1 was used with the International Committee for Diffraction Data database PDF4+ 2008 for phase identification and data analysis.

IV Analysis. Current (I) versus voltage (V) measurements were performed on the samples using two Agilent 5281B precision medium power SMUs in a E5270B mainframe in a four point probe configuration. Samples were illuminated with an Oriel 81150 solar simulator under 1 sun AM 1.5 G.

EQE Analysis. External Quantum Efficiency (EQE) determinations were carried out as described in ASTM Standard E1021-06 ("Standard Test Method for Spectral Responsivity Measurements of Photovoltaic Devices"). The reference detector in the apparatus was a pyroelectric radiometer (Laser Probe (Utica, N.Y.), LaserProbe Model RkP-575 controlled by a LaserProbe Model Rm-6600 Universal Radiometer). The excitation light source was a xenon arc lamp with wavelength selection provided by a monochrometer in conjunction with order sorting filters. Optical bias was provided by a broad band tungsten light source focused to a spot slightly larger than the monochromatic probe beam. Measurement spot sizes were approximately 1 mm×2 mm.

OBIC Analysis. Optical beam induced current measurements were determined with a purpose-constructed apparatus employing a focused monochromatic laser as the excitation source. The excitation beam was focused to a spot ~100 microns in diameter. The excitation spot was rastered over the surface of the test sample while simultaneously measuring photocurrent so as to build a map of photocurrent vs position for the sample. The resulting photocurrent map characterizes the photoresponse of the device vs. position. The apparatus can operate at various wavelengths via selection of the excitation laser. Typically, 440, 532 or 633 nm excitation sources were employed.

Example 1

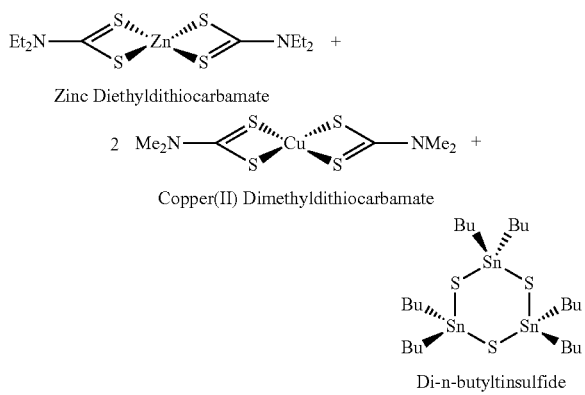

Zinc Diethyldithiocarbamate

Copper(II) Dimethyldithiocarbamate

Di-n-butyltinsulfide

Zinc diethyldithiocarbamate (0.5919 g, 1.635 mmol), copper(II) dimethyldithiocarbamate (0.9930 g, 3.267 mmol), and di-n-butyltinsulfide (0.4506 g, 1.701 mmol) were placed in a 40 mL amber vial equipped with a stir bar. 4-t-Butylpyridine (4.4144 g) was added, and the resulting mixture was stirred well. Next, 0.0520 g (1.621 mmol) of elemental sulfur was added. The reaction mixture was stirred for ~12 hr at room temperature and then ~40 hr at a first heating temperature of 105° C. Next, the reaction mixture was stirred for ~8 hr at a second heating temperature of 190° C. A SLG slide was coated via drop-coating according to the following procedure: While being maintained at 105° C. with stirring, a small portion of the formulation was drawn into a pipette and then spread uniformly onto the substrate, which was also heated to 105° C. The coating on the SLG slide was then dried in the drybox by raising the temperature of the hotplate from 105° C. to 170° C. for 0.5 h. The dried sample was annealed under a nitrogen/sulfur atmosphere at 550° C. for 1 hr. Analysis of the annealed sample by XRD and XAS confirmed the presence of CZTS.

Example 1A

Example 1 was repeated using pyridine or toluene or 3-aminopyridine in place of 4-t-butylpyridine, with the second heating temperature of ~105° C., 105° C., and 170° C., respectively. For samples prepared in pyridine, the annealing temperature/time was 400° C./0.5 h for the sample prepared in pyridine; 500° C./0.5 h for the toluene sample; and 550° C./1 h for the 3-aminopyridine sample. Analysis of the annealed samples by XRD and XAS also confirmed the presence of CZTS.

Example 1B

Example 1 was repeated with annealing carried out under a nitrogen atmosphere by RTA. Analysis of the annealed sample by XRD also confirmed the presence of CZTS.

Example 1C

Example 1 was repeated, but the formulation was deposited on a Mo-patterned SLG slide. Also, the temperature of the hotplate was raised from 105 to 180° C. over the course of 2 hr, and the coating was annealed at 550° C. for 0.5 hr. Cadmium sulfide, insulating ZnO and AZO, and silver lines were deposited. Analysis by OBIC at 440 nm and 633 nm showed photoresponses greater than 5 and 0.75 micro-Amp, respectively, adjacent to the silver line.

Example 2

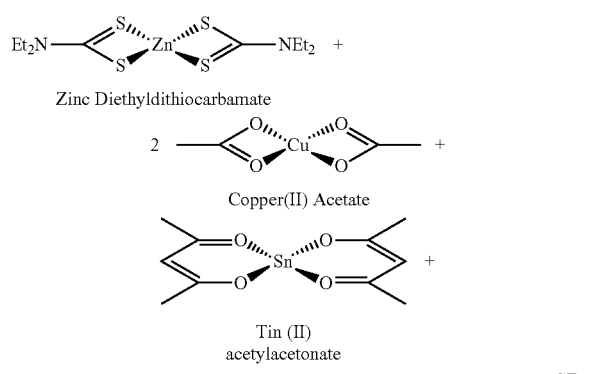

In the drybox, zinc diethyldithiocarbamate (0.2956 g, 0.817 mmol), copper(II) acetate (0.2974 g, 1.64 mmol), and tin(II) acetylacetonate (0.2634 g, 0.831 mmol) were placed in a 20 mL vial equipped with a stir bar. Pyridine (0.8 mL) was added, and the resulting mixture was stirred well. Next, a solution of 0.6789 g (5.05 mmol) of (ethylthio)trimethylsilane in 0.2 mL of pyridine was added. The reaction mixture was stirred for ~12 hr at room temperature and then ~40 hr at a first heating temperature of 105° C. Next, the reaction mixture was stirred for ~8 hr at a second heating temperature of 110° C. An untreated glass slide was coated via drop-coating in a manner similar to described above in Example 1. The coated substrate was then placed on a hot plate and heated to 120° C. for ~0.5 hr. The coated substrate was allowed to remain on the hotplate as it cooled to room temperature. The coated substrate was annealed in the tube furnace at 500° C. under a nitrogen/sulfur atmosphere for 0.5 hr. Analysis of the annealed sample by XRD confirmed the presence of CZTS. Spectrophotometric measurements showed a bandgap at 110 nm (~1.13 eV) for a 4 micron-thick film.

Example 2A

Example 2 was repeated using 2-aminopyridine in place of pyridine, with the second heating temperature about 190° C., a drying temperature of 170° C., and an annealing temperature of 550° C. for 1 hr. Analysis of the annealed sample by XRD and XAS also confirmed the presence of CZTS.

Example 2B

Example 2 was repeated using no additional solvent and the solution was stirred at room temperature for several days without heating prior to coating. The coating was produced via blade-coating, with both the formulation and substrate initially at room temperature. The thickness of the coating was controlled by placing 0.003 feeler stock on either side of the area to be coated, and a thicker piece of feeler stock was used as the blade. The drying temperature was 110 deg C. for ~0.5 hr, and the annealing temperature was 550° C. for 0.5 hr. Analysis of the annealed sample by XRD and XAS also confirmed the presence of CZTS. Spectrophotometric measurements showed a bandgap at 850 nm (~1.45 eV) for an ~5 micron-thick film.

Example 2C

Example 2 was repeated, but the formulation was deposited on a Mo-patterned SLG slide. Cadmium sulfide and insulating ZnO and AZO were deposited. Analysis by OBIC at 440 nm showed a photoresponse greater than 0.2 micro-Amp. Also, IV analysis showed diode-like behavior, with $V_{OC}$ of 78 mV, $J_{SC}$ of 0.119 mA/cm$^2$, FF of 23.6%, and efficiency of 0.002%.

Example 3

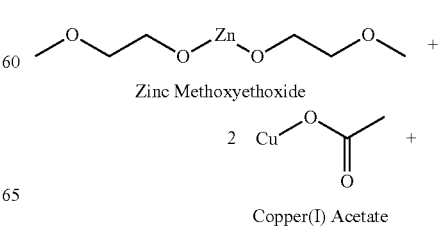

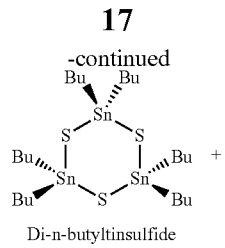

Di-n-butyltinsulfide

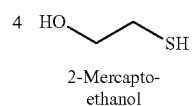

2-Mercaptoethanol

A formulation was prepared according to the procedure of Example 1, using zinc methoxyethoxide (0.8184 mmol), copper(I) acetate (1.636 mmol), di-n-butyltinsulfide (0.8276 mmol), 2-mercaptoethanol (3.426 mmol), and sulfur (0.7795 mmol) in diethylnicotinamide (1.0871 g). The reaction mixture was stirred for ~12 hr at room temperature and then ~40 hr at 105° C. Next, the reaction mixture was stirred ~8 hr at 190° C. An untreated glass slide was coated via drop-coating according to the procedure of Example 1, and then dried at 170-190° C. on the hotplate in the drybox. Annealing was carried out at 550° C. for 30 min in a nitrogen/sulfur atmosphere. Analysis of the annealed sample by XRD confirmed the presence of CZTS.

Example 3A

Example 3 was repeated using 4-t-butylpyridine, 1,2,4-trichlorobenzene, or 3-methoxypropionitrile as the solvent. The temperature of the second heating step was 160-190° C., 190° C., and 150° C., respectively for these solvents. Analysis of the annealed samples by XRD confirmed the presence of CZTS.

Example 3B

Example 3 was also repeated using zinc methoxyethoxide (0.8829 mmol), copper(I) acetate (1.518 mmol), di-n-butyltinsulfide (0.8884 mmol), 2-mercaptoethanol (3.673 mmol), and sulfur (0.8045 mmol) in 2- or 3-aminopyridine (1.0314 g), and a second heating temperature of 170° C. CZTS was detected in both the dried and the annealed samples by XAS.

Example 4

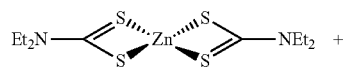

Zinc Diethyldithiocarbamate

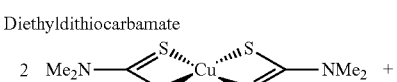

Copper(II) Dimethyldithiocarbamate

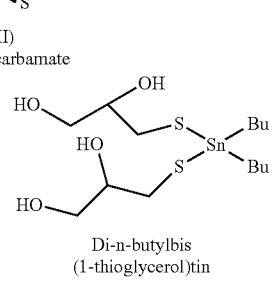

Di-n-butylbis(1-thioglycerol)tin

In the drybox, zinc diethyldithiocarbamate (0.2952 g, 0.816 mmol), copper(II) dimethyldithiocarbamate (0.4959 g, 1.631 mmol), and di-n-butylbis(1-thioglycerol)tin (0.3648 g, 0.834 mmol) were placed together in a 20 mL vial equipped with a stir bar. Pyridine (2.5 mL) was added, and the resulting mixture was stirred well. One equiv of sulfur was added and the resulting mixture was stirred overnight at room temperature. Next, the formulation was heated ~40 hr at 110° C.

While maintaining the formulation at 105° C. with stirring, a small portion was drawn into a pipette and then spread uniformly onto two untreated glass substrates, which were heated to 105° C. The coatings were further dried by raising the temperature of the hotplate to 120° C. for ~1 h. One of the coatings was then annealed under a nitrogen/sulfur atmosphere at 500° C. for 30 min.

XAS analysis confirmed the presence of CZTS in both the dried coating and the annealed coating.

Example 5

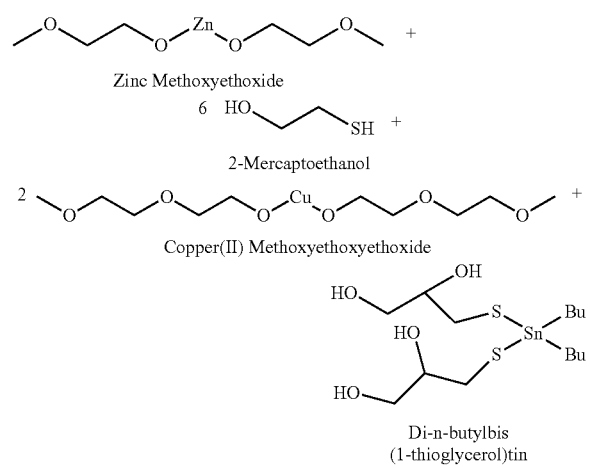

Zinc Methoxyethoxide

2-Mercaptoethanol

Copper(II) Methoxyethoxyethoxide

Di-n-butylbis(1-thioglycerol)tin

A formulation was prepared according to the procedure of Example 4 using zinc methoxyethoxide (0.2385 g, 0.271 mmol); 1.4965 g of a 10-12 wt % solution (0.545 mmol assuming 11 wt %) of copper(II) methoxyethoxyethoxide in methoxyethoxyethanol; 0.1218 g (0.272 mmol) of di-n-butylbis(1-thioglycerol)tin; 0.1326 g (1.697 mmol) of 2-mercaptoethanol; and 0.0089 g (0.278 mmol) of elemental sulfur. A coating on treated glass was dried at 120° C. for 0.5 hr and then annealed under a nitrogen/sulfur atmosphere at 650° C. for 30 min. Analysis of the annealed sample by XRD and XAS confirmed the presence of CZTS.

Example 6

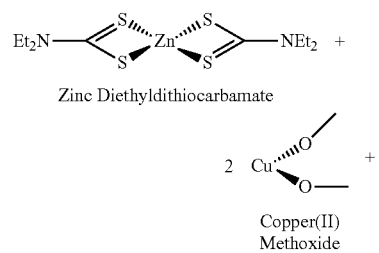

Zinc Diethyldithiocarbamate

Copper(II) Methoxide

-continued

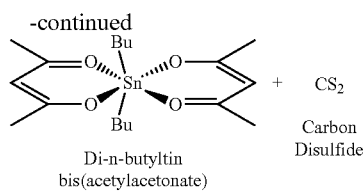

Di-n-butyltin
bis(acetylacetonate)

+ CS₂

Carbon
Disulfide

In the drybox, 0.5917 g (1.635 mmol) of zinc diethyldithiocarbamate, 0.4092 g (3.257 mmol) of copper(II) methoxide, 0.7097 of di-n-butyltin bis(acetylacetonate), 0.7625 g (10.01 mmol) of carbon disulfide, and 1.6 mL of pyridine were placed in separate vials and cooled in the −25° C. freezer. Next, one-fourth of the cold pyridine (~0.4 mL) was added to each of the reagent vials and the vials were returned to the freezer. Approximately two-thirds of the carbon disulfide solution in pyridine was added to the copper suspension, and the remaining one-third of the carbon disulfide solution was added to the tin solution. The contents were mixed well and the vials were returned to the freezer. The cold zinc mixture and the cold tin solution were added to the copper suspension. The resulting mixture was stirred overnight and allowed to warm to room temperature. The next day, 0.0522 g (1.628 mmol) of elemental sulfur was added to the reaction mixture and it was stirred at room temperature for more than 48 hr before heating.

A coating on glass was annealed under a nitrogen/sulfur atmosphere at 550° C. for 30 min. Analysis by XRD and XAS confirmed the presence of CZTS.

Example 6A

Example 6 was repeated, but the formulation was deposited on a Mo-patterned SLG substrate. Cadmium sulfide and insulating ZnO and AZO were deposited. Analysis by OBIC at 440 nm showed a photoresponse greater than 0.1 microAmp adjacent. Analysis of the sample via EQE demonstrated that the PV device exhibited a photoresponse consistent with the semiconductor absorber having a band gap energy of 1.53+/−0.04 eV, consistent with the absorber being assigned as CZTS.

Examples 7-9

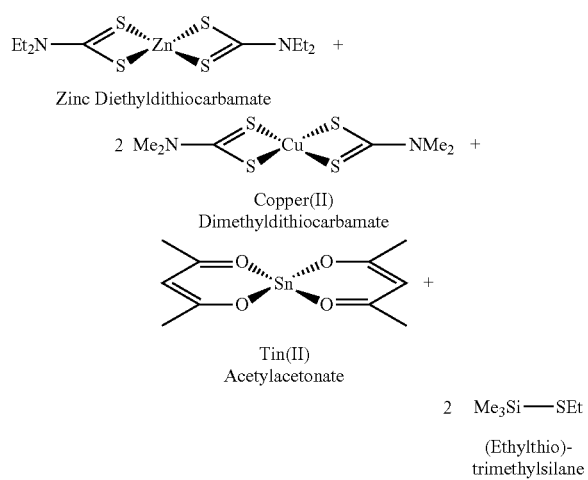

Formulations were prepared according to the procedure of Example 1 using 0.2952 g (0.816 mmol) of zinc diethyldithiocarbamate, 0.4960 g (1.632 mmol) of copper(II) dimethyldithiocarbamate, 0.2696 g (0.851 mmol) of tin(II) acetylacetonate, and 0.2469 g (1.838 mmol) of (ethylthio) trimethylsilane. After being thoroughly mixed, the reaction mixture was divided into thirds and placed in three 4 mL vials equipped with stir bars. One of these vials was used for Example 7 and received no additional reagents. The second heating temperature was 110° C., two SLG slides were drop-coated according to the procedure of Example 1, both coatings were dried at 120° C. and one of these coatings was annealed at 400° C. Another vial was used for Example 8, and 0.0082 g of elemental sulfur (1 equiv) was added to the vial. The second heating temperature was 110° C., a coating was prepared on a SLG slide with drying temperature at 120° C., and the annealing temperature was 400° C. The formulation of Example 9 was analogous to that of Example 8, except that 2-aminopyridine was used as the solvent. The second heating temperature was 190° C., the drying temperature was 170-190° C., and the annealing temperature was 550° C.

CZTS was detected in all of the annealed samples and the dried sample of Example 7 by XRD and/or XAS.

Example 10

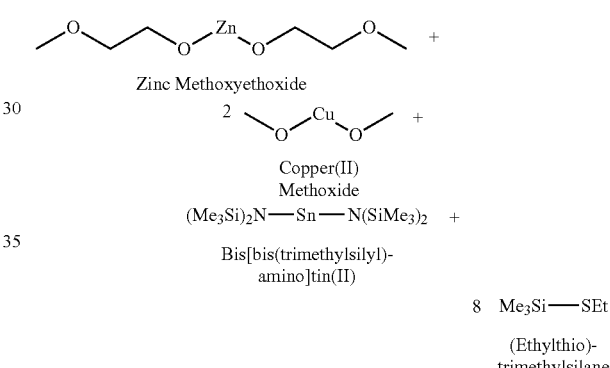

A formulation was prepared according to the procedure of Example 1 using 0.1768 g (0.820 mmol) of zinc methoxyethoxide, 0.2047 g (1.630 mmol) of copper(II) methoxide, 0.4004 g (0.911 mmol) of bis[bis(trimethysilyl)amino]tin(II), 0.8990 g (6.692 mmol) of ethylthiotrimethylsilane, 0.0259 g (0.808 mmol) of elemental sulfur, and 0.4700 g of 3,5-lutidine. The second heating temperature was 165° C.

The formulation was coated on an untreated glass slide and dried at 170° C. The coating was annealed at 550° C. for 30 min, and was then analyzed by XRD, which indicated kesterite as the predominant component and a trace amount of covelite (CuS).

Example 11

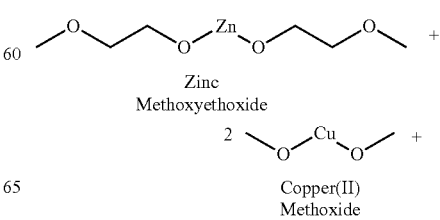

-continued

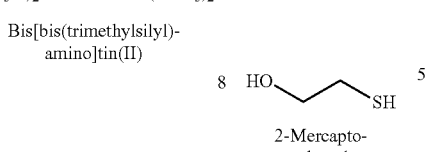

Bis[bis(trimethylsilyl)-
amino]tin(II)

8  HO∼SH

2-Mercapto-
ethanol

A formulation was prepared according to the procedure of Example 1 using 0.1754 g (0.814 mmol) of zinc methoxyethoxide, 0.2055 g (1.636 mmol) of copper(II) methoxide, 0.3983 g (0.906 mmol) of bis[bis(trimethysilyl)amino]tin(II), 0.5226 g (6.69 mmol) of 2-mercaptoethanol, 0.0258 g (0.804 mmol) of elemental sulfur and 0.9520 g of 3,5-lutidine. The second heating temperature was 165° C.

The formulation was drop-cast onto two untreated slides and two treated slides. The two coatings on the untreated slides were dried at 210° C., and the two coatings on the treated slides were dried at 250° C. One of the coatings on an untreated slide was annealed at 550° C. for 1 hr, and one of the coatings on a treated slide was annealed at 550° C. for 0.5 hr. The coatings were analyzed by XAS, and the presence of CZTS was confirmed in the annealed coatings.

Examples 12-13

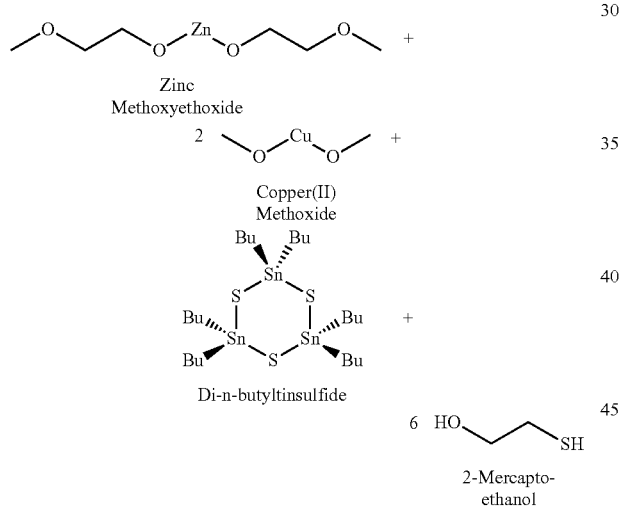

According to the procedure of Example 1, the formulation of Example 12 was prepared using 0.1829 g (0.849 mmol) of zinc methoxyethoxide, 0.2110 g (1.680 mmol) of copper(II) methoxide, 0.2299 g (0.868 mmol) of di-n-butyltin sulfide, 0.4085 g (5.23 mmol) of 2-mercaptoethanol, and 0.916 g of 4-t-butylpyridine. The second heating temperature was 190° C.

According to the procedure of Example 1, the formulation of Example 13 was prepared using 0.1830 g (0.849 mmol) of zinc methoxyethoxide, 0.1947 g (1.550 mmol) of copper(II) methoxide, 0.2440 g (0.921 mmol) of di-n-butyltin sulfide, 0.4049 g (5.18 mmol) of 2-mercaptoethanol, 0.792 mmol of sulfur, and 0.926 g of 4-t-butylpyridine. The second heating temperature was 190° C.

Each formulation was drop-cast onto two untreated glass slides and the coatings were dried at 170° C. One coating of each formulation was then annealed at 550° C. for 0.5 hr. The coatings were analyzed by XAS, and the presence of CZTS was confirmed in the annealed coatings.

Example 14

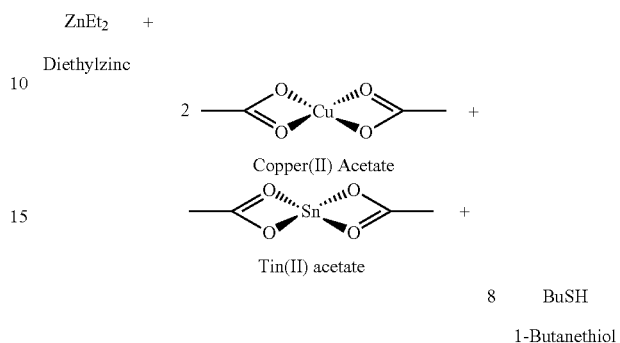

1-Butanethiol (0.6024 g, 6.68 mmol) was weighed into a vial and combined with 0.2 mL of pyridine. Copper(II) acetate (0.2971 g, 1.636 mmol) and tin(II) acetate (0.1931 g, 0.815 mmol) were placed together in 20 mL vial equipped with a stir bar. Next, 0.8 mL of pyridine was added to the vial followed by the addition of the 1-butanethiol solution. The contents of the vial were mixed well for 30 min. Diethylzinc (816 micro-L of a 1.0 M solution in hexanes) was then added to the reaction mixture, which was again mixed well for ~10 min. Next, approximately one-fifth of the reaction mixture was added to a 4 mL vial that was equipped with a stir bar and contained 0.0054 g of sulfur (~1 equiv). The reaction mixture was stirred at room temperature for several days.

Following heating at 110° C., the formulation was drop-coated onto untreated glass, dried at 120° C., and then annealed at 500° C. for 0.5 hr. Analysis by XRD indicates the presence of CZTS.

Example 15

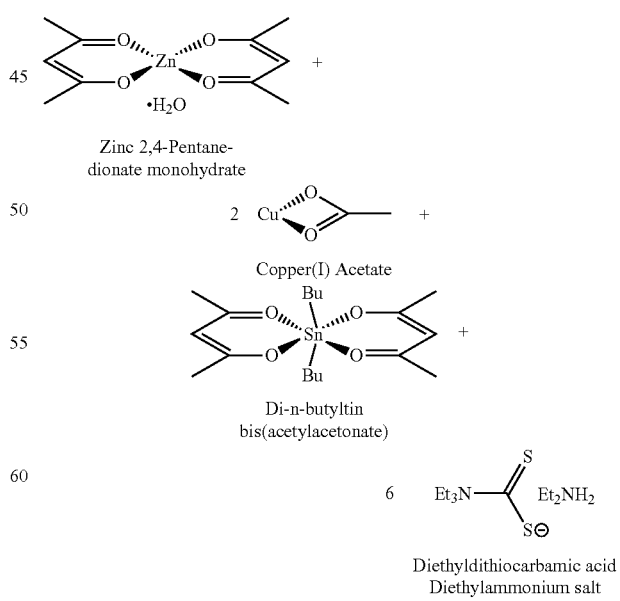

According to the procedure of Example 1, the formulation of Example 15 was prepared using 0.0.2312 g (0.821 mmol)

of zinc 2,4-pentanedionate monohydrate, 0.1999 g (1.631 mmol) of copper(I) acetate, 0.3885 g (0.901 mmol) of di-n-butyltin bis(acetylacetonate), 1.0881 g (4.89 mmol) of diethyldithiocarbamic acid diethylammonium salt, 0.0264 g (0.823 mmol) of elemental sulfur, and 1.433 g of 4-t-butylpyridine. The second heating temperature was 190° C.

The formulation was drop-coated onto untreated glass, dried at 180° C., and annealed at 550° C. for 0.5 hr. Analysis by XAS confirmed the presence of CZTS in the annealed sample.

Example 16

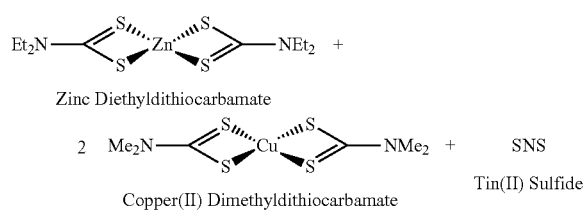

Zinc Diethyldithiocarbamate

Copper(II) Dimethyldithiocarbamate

Tin(II) Sulfide

According to the procedure of Example 1, the formulation of Example 16 was prepared using 0.851 mmol of zinc diethyldithiocarbamate, 1.595 mmol of copper(II) dimethyldithiocarbamate, 0.949 mmol of tin(II) sulfide, 0.823 mmol of elemental sulfur, and 2.895 g of N-methyl-2-pyrrolidinone. The second heating temperature was at 170-190° C.

The formulation was drop-coated onto two untreated glass slides, the coatings were dried at 180° C. and then one of the coatings was annealed at 550° C. for 1 hr. Analysis by XRD and XAS confirmed the presence of CZTS in the annealed sample; XAS analysis confirmed the presence of CZTS in the dried (un-annealed) sample.

This procedure was repeated using 4-t-butylpyridine (1.237-1.5 g), 2-aminopyridine (1.067-1.103 g) or 3-aminopyridine (1.016-1.048 g) as solvent, with or without the addition of elemental sulfur. Prior to coating, ~1 mL of 4-t-butylpyridine was added to the aminopyridine-based formulations. Analysis by XRD confirmed the presence of CZTS in all six of the annealed samples.

Example 17

A formulation analogous to that of Example 1 and a treated SLG substrate were both heated to 105° C. After drop-coating the formulation, the coated substrate was maintained at 105° C. for 20 min and then at 220° C. for a total of 83 min. The substrate was cooled to 105° C. and a second layer of the same formulation was drop-coated onto it. The temperature was maintained at 105° C. for ~2.5 hr and then at 220° C. for ~1 hr. The substrate was then allowed to cool to room temperature. Next, the formulation of Example 16 using 3-amino-pyridine as the solvent without the addition of elemental sulfur was spun-coated to give a third layer. The substrate was heated at 105° C. for several hr and then for 20-30 min at 220° C., then cooled to room temperature. The substrate was annealed for 90 min under a nitrogen/sulfur atmosphere at 550° C. Analysis by XRD confirmed the presence of CZTS.

Example 18

A coated substrate was prepared analogously to that of Example 17 except that the third layer was not applied. The substrate was annealed for 90 min under a nitrogen/selenium atmosphere. XRD analysis indicated the presence of CZTS-Se, with sulfur partially (67.8%) replaced with selenium.

Example 19

The formulation of Example 16 using 2-aminopyridine as the solvent and without the addition of elemental sulfur was spun-coated onto a treated SLG substrate. The substrate was then heated at 105° C. for at least 2 hr, cooled to room temperature, heated to 170° C. for 70 min, and cooled to room temperature. Next, a formulation analogous to that used for Example 1, except with only 2.2 g of 4-t-butylpyridine, was spun on top of the first coating. The substrate was heated at 105° C. for several hr, then at 170° C. for 20 min, and cooled to room temperature. After annealing by RTA under nitrogen, XRD indicated the presence of CZTS. The substrate was then annealed in a furnace under a selenium/nitrogen atmosphere for 90 min at 550° C. XRD indicated the presence of CZTS-Se, with sulfur partially (67.1%) replaced with selenium.

Example 20

Zinc sulfide (0.915 mmol), copper(II) sulfide (1.539 mmol), and tin(II) sulfide (0.884 mmol) were placed in a 40 mL amber vial equipped with a stir bar. 3-Methoxypropylamine (0.893 g) was added, and the resulting mixture was stirred well. Next, 0.798 mmol of elemental sulfur was added. The reaction mixture was stirred for ~12 hr at room temperature and then ~48 hr at 105° C. The formulation was then drop-coated onto a treated SLG slide according to procedure of Example 1. The coating was then dried in the drybox by raising the temperature of the hotplate from 105° C. to 170° C. for 0.5 hr. The coating was annealed at 550° C. for 0.5 hr. Analysis of the annealed sample by XAS confirmed the presence of CZTS.

Example 21

Formulation and coating was analogous to that of Example 1, except that no zinc compound was used in the formulation. The coated substrate was annealed under selenium/nitrogen vapor for 90 min at 550° C. The XRD analysis indicated the presence of CTS-Se, with sulfur partially (71.4%) replaced with selenium and with an average grain size of greater than 100 nm.

Example 22

Example 16 was repeated using 4-t-butylpyridine as the solvent and tin(II) selenide in place of tin(II) sulfide. The XRD analysis indicated the presence of CTS-Se, with sulfur partially (76.8%) replaced with selenium and with an average grain size of 35.2 nm

What is claimed is:

1. An ink comprising:
   i) a copper source selected from the group consisting of copper complexes of nitrogen-, oxygen-, carbon-, sulfur-, and selenium-based organic ligands, copper sulfides, copper selenides, and mixtures thereof;
   ii) a tin source selected from the group consisting of tin complexes of nitrogen-, oxygen-, carbon-, sulfur-, and selenium-based organic ligands, tin hydrides, tin sulfides, tin selenides, and mixtures thereof;
   iii) optionally, a zinc source selected from the group consisting of zinc complexes of nitrogen-, oxygen-, carbon-, sulfur-, and selenium-based organic ligands, zinc sulfides, zinc selenides, and mixtures thereof;

iv) a chalcogen compound selected from the group consisting of: elemental S, elemental Se, and mixtures thereof; and, v) a heteroaromatic solvent.

2. The ink of claim 1, wherein the ratio of the total number of moles of the chalcogen compound, the sulfur- and selenium-based organic ligands, and the copper-, tin-, and zinc-sulfides and selenides to the total number of moles of the copper, tin and zinc complexes is at least about 1.

3. The ink of claim 1, wherein a zinc source is present.

4. The ink of claim 2, wherein a zinc source is present.

5. The ink of claim 1, wherein the molar ratio of (S +Se) is about 0.2 to about 5 relative to the tin source.

6. The ink of claim 1, wherein the nitrogen-, oxygen-, carbon-, sulfur-, and selenium-based organic ligands are selected from the group consisting of: amidos; alkoxides; acetylacetonates; carboxylates; hydrocarbyls; O—, N—, S—, halogen-, and tri(hydrocarbyl)silyl-substituted hydrocarbyls; thio- and selenolates; thio-, seleno-, and dithiocarboxylates; dithio-, diseleno-, and thioselenocarbamates; and dithioxanthogenates.

7. The ink of claim 1, wherein the boiling point of the solvent is greater than about 100° C. at atmospheric pressure.

8. The ink of claim 1, wherein the ink has been heat-processed at temperature of greater than about 100° C.

9. The ink of claim 1, further comprising up to about 10 wt% of one or more additives selected from the group consisting of: dispersants, surfactants, polymers, binders, ligands, capping agents, defoamers, thickening agents, corrosion inhibitors, plasticizers, and dopants.

10. The ink of claim 1, wherein the molar ratio of copper to tin is about 2:1.

11. The ink of claim 10, wherein a molar ratio of copper to zinc to tin is about 2:1:1.

12. The ink of claim 1 further comprising a chalcogen compound selected from the group consisting of: $CS_2$, $CSe_2$, CSSe, $R^1S-Z$, $R^1Se-Z$, $R^1S-SR^1$, $R^1Se-SeR^1$, $R^2C(S)S-Z$, $R^2C(Se)Se-Z$, $R^2C(Se)S-Z$, $R^1C(O)S-Z$, $R^1C(O)Se-Z$, and mixtures thereof, with each Z independently selected from the group consisting of: H, $NR^4_4$, and $SiR^5_3$; wherein each $R^1$ and $R^5$ is independently selected from the group consisting of: hydrocarbyl and O—, N—, S—, halogen- and tri(hydrocarbyl)silyl-substituted hydrocarbyl; each $R^2$ is independently selected from the group consisting of hydrocarbyl, O—, N—, S—, Se—, halogen-, and tri(hydrocarbyl)silyl-substituted hydrocarbyl, and O—, N—, S—, and Se—based functional groups; and each $R^4$ is independently selected from the group consisting of hydrogen, O—, N—, S—, Se—, halogen- and tri(hydrocarbyl)silyl-substituted hydrocarbyl, and O—, N—, S—, and Se—based functional groups.

13. The ink of claim 1, wherein the solvent comprises about 95 to about 5 wt% of the ink, based upon the total weight of the ink.

14. The ink of claim 12, wherein the ratio of the total number of moles of the chalcogen compound, the sulfur- and selenium-based organic ligands, and the copper-, tin-, and zinc-sulfides and selenides to the total number of moles of the copper, tin and zinc complexes is at least about 1.

* * * * *